US 9,564,507 B2

(12) United States Patent
Lin et al.

(10) Patent No.: US 9,564,507 B2
(45) Date of Patent: Feb. 7, 2017

(54) INTERLAYER DIELECTRIC LAYER WITH TWO TENSILE DIELECTRIC LAYERS

(71) Applicant: UNITED MICROELECTRONICS CORP., Hsin-Chu (TW)

(72) Inventors: Yu-Cheng Lin, Tainan (TW); Hui-Shen Shih, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/003,813

(22) Filed: Jan. 22, 2016

(65) Prior Publication Data

US 2016/0141383 A1    May 19, 2016

Related U.S. Application Data

(63) Continuation of application No. 14/328,717, filed on Jul. 11, 2014, now Pat. No. 9,281,238.

(51) Int. Cl.
| | |
|---|---|
| *H01L 21/768* | (2006.01) |
| *H01L 21/02* | (2006.01) |
| *H01L 29/78* | (2006.01) |
| *H01L 21/31* | (2006.01) |
| *H01L 29/51* | (2006.01) |
| *H01L 23/532* | (2006.01) |
| *H01L 23/535* | (2006.01) |
| *H01L 29/423* | (2006.01) |

(52) U.S. Cl.
CPC ............ *H01L 29/51* (2013.01); *H01L 21/022* (2013.01); *H01L 21/02126* (2013.01); *H01L 21/02274* (2013.01); *H01L 21/76801* (2013.01); *H01L 21/76819* (2013.01); *H01L 21/76822* (2013.01); *H01L 21/76825* (2013.01); *H01L 21/76826* (2013.01); *H01L 21/76835* (2013.01); *H01L 21/76838* (2013.01); *H01L 23/535* (2013.01); *H01L 23/53295* (2013.01); *H01L 29/42376* (2013.01); *H01L 29/78* (2013.01); *H01L 2924/0002* (2013.01)

(58) Field of Classification Search
CPC ..................................................... H01L 29/51
USPC ............................................................. 257/737
See application file for complete search history.

(56) References Cited

U.S. PATENT DOCUMENTS 5,674,599 A * 10/1997 Yamada ............... C23C 14/0652
                                                                257/E23.007
5,936,304 A    8/1999 Lii
6,049,124 A    4/2000 Raiser
(Continued)

OTHER PUBLICATIONS

M. Tagami et al., "Moisture Uptake Impact on Damage Layer of Porous Low-k Film in 80nm-pitched Cu interconnects," Abstract #2138, 220th ECS Meeting, 2011 The Electrochemical Society.

*Primary Examiner* — Long K Tran
*Assistant Examiner* — Thai T Vuong
(74) *Attorney, Agent, or Firm* — Winston Hsu; Scott Margo

(57) ABSTRACT

A semiconductor device is disclosed. The semiconductor device includes: a substrate; a first tensile dielectric layer on the substrate; a metal gate in the first tensile dielectric layer; a second tensile dielectric layer on the first tensile dielectric layer; and a contact plug in the first tensile dielectric layer and the second tensile dielectric layer. Preferably, the top surface of the contact plug is even with the top surface of the second tensile dielectric layer, and a carbon content of the second tensile dielectric layer is greater than the carbon content of the first tensile dielectric layer.

5 Claims, 1 Drawing Sheet

(56) References Cited

U.S. PATENT DOCUMENTS

| | | | |
|---|---|---|---|
| 6,049,129 | A | 4/2000 | Yew |
| 6,075,289 | A | 6/2000 | Distefano |
| 6,124,191 | A | 9/2000 | Bohr |
| 6,184,142 | B1 | 2/2001 | Chung et al. |
| 6,191,952 | B1 | 2/2001 | Jimarez |
| 7,009,280 | B2 | 3/2006 | Angyal et al. |
| 7,381,451 | B1 * | 6/2008 | Lang .................. C23C 16/402 257/E21.703 |
| 8,278,718 | B2 | 10/2012 | Fischer et al. |
| 8,389,410 | B2 | 3/2013 | Wu et al. |
| 2003/0003771 | A1 * | 1/2003 | Yang .................. C23C 16/325 438/783 |
| 2003/0232495 | A1 | 12/2003 | Moghadam |
| 2004/0099952 | A1 * | 5/2004 | Goodner ........... H01L 21/02118 257/758 |
| 2004/0192032 | A1 * | 9/2004 | Ohmori ............ H01L 21/76807 438/655 |
| 2005/0093108 | A1 * | 5/2005 | Chang ................ G02B 6/3584 257/635 |
| 2005/0156285 | A1 * | 7/2005 | Gates .................. C23C 16/401 257/632 |
| 2005/0233576 | A1 * | 10/2005 | Lee ........................ C23C 16/30 438/623 |
| 2006/0014377 | A1 * | 1/2006 | Kim .................. H01L 21/76801 438/623 |
| 2006/0219174 | A1 | 10/2006 | Nguyen |
| 2006/0226519 | A1 | 10/2006 | Masonobu |
| 2008/0305625 | A1 | 12/2008 | Jiang |
| 2009/0050604 | A1 * | 2/2009 | Jacques ............ H01L 21/02079 216/64 |
| 2009/0121313 | A1 | 5/2009 | Hashimoto |
| 2010/0196806 | A1 | 8/2010 | Bucchignano et al. |
| 2013/0072031 | A1 | 3/2013 | Peng et al. |
| 2013/0189841 | A1 | 7/2013 | Balseanu |

\* cited by examiner

INTERLAYER DIELECTRIC LAYER WITH TWO TENSILE DIELECTRIC LAYERS

CROSS REFERENCE TO RELATED APPLICATIONS

This is a continuation application of U.S. patent application Ser. No. 14/328,717, filed on Jul. 11, 2014, and all benefits of such earlier application are hereby claimed for this new continuation application.

BACKGROUND OF THE INVENTION

1. Field of the Invention

The invention relates to an interlayer dielectric (ILD) layer, and more particularly, to an ILD layer having two tensile dielectric layers.

2. Description of the Prior Art

Semiconductor devices are typically joined together to form useful circuits using interconnect structures comprising conductive materials (e.g., metal lines) such as copper (Cu) or aluminum (Al) and dielectric materials such as silicon dioxide ($SiO_2$). The speed of these interconnects can be roughly assumed to be inversely proportional to the product of the line resistance (R), and the capacitance (C) between lines. To reduce the delay and increase the speed, it is desirable to reduce the capacitance (C). This can be done by reducing the dielectric constant k of the dielectric material in the interlayer dielectric (ILD) layers.

Conventional approach for fabricating ILD layer typically includes forming a single layer of silicon dioxide on a substrate. This design is particularly disadvantageous when planarizing process, such as chemical mechanical polishing (CMP) process is conducted to remove the contact metal along with the ILD layer, a major portion of the ILD is lost due to topography loading effect during process and the height of the ILD layer is affected substantially.

SUMMARY OF THE INVENTION

It is therefore an objective of the present invention to provide a method for resolving the aforementioned issues.

According to a preferred embodiment of the present invention, a method for fabricating interlayer dielectric (ILD) layer is disclosed. The method includes the steps of first forming a first tensile dielectric layer on a substrate, and then forming a second tensile dielectric layer on the first tensile dielectric layer According to another aspect of the present invention, a semiconductor device is disclosed. The semiconductor device includes: a substrate; a first tensile dielectric layer on the substrate; a metal gate in the first tensile dielectric layer; a second tensile dielectric layer on the first tensile dielectric layer; and a contact plug in the first tensile dielectric layer and the second tensile dielectric layer. Preferably, the top surface of the contact plug is even with the top surface of the second tensile dielectric layer, and a carbon content of the second tensile dielectric layer is greater than the carbon content of the first tensile dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
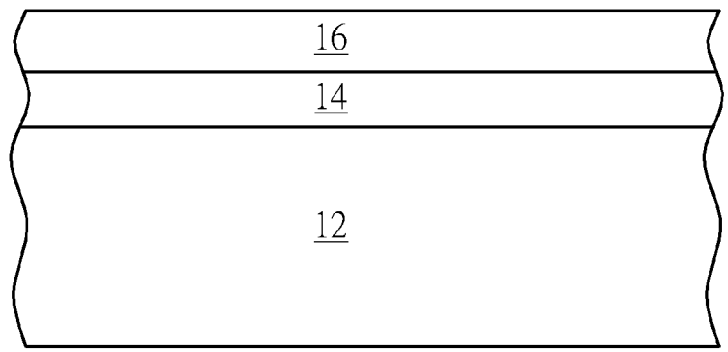
FIGS. 1-2 illustrate a method for fabricating ILD layer according to a preferred embodiment of the present invention.
Figure 2:
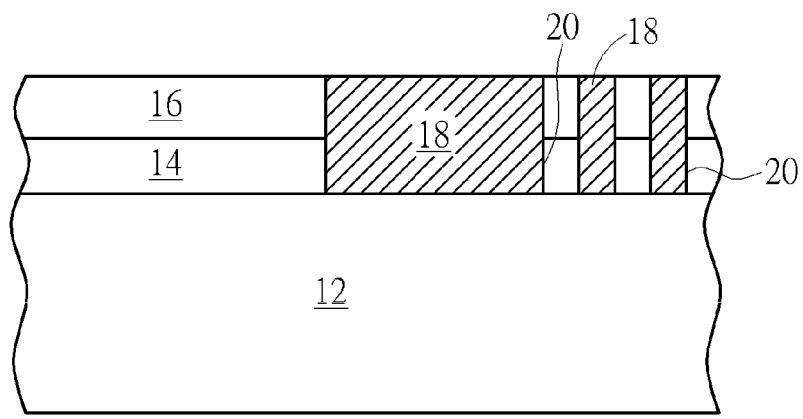

Referring to FIGS. 1-2, FIGS. 1-2 illustrate a method for fabricating ILD layer according to a preferred embodiment of the present invention. As shown in FIG. 1, a substrate 12, such as a substrate composed of monocrystalline silicon, gallium arsenide (GaAs) or other known semiconductor material is provided. At least one metal-oxide semiconductor (MOS) transistor (not shown), or other semiconductor devices is then formed on the substrate. The MOS transistor could be a PMOS transistor, a NMOS transistor, a CMOS transistor, or a fin field-effect transistor (FinFET), and the MOS transistor could also include typical transistor structures including metal gate, spacer, lightly doped drains, source/drain regions, and/or silicides.

Next, a first tensile dielectric layer 14 is deposited on the substrate 12, preferably covering the MOS transistor, and a second tensile dielectric layer 16 is formed on the first tensile dielectric layer 14 thereafter. The deposition of the first tensile dielectric layer 14 and the second tensile dielectric layer 16 could be accomplished by a plasma-enhanced chemical vapor deposition (PECVD) process, and according to a preferred embodiment of the present invention, each of the first tensile dielectric layer 14 and the second tensile dielectric layer 16 is composed of an ultra low-k dielectric material, such as a silicon dioxide ($SiO_2$) layer doped with carbon.

Preferably, the first tensile dielectric layer 14 and the second tensile dielectric layer 16 are deposited such that a gradient of carbon content is established between the two dielectric layers 14 and 16, in which the carbon content of the second tensile dielectric layer 16 is substantially greater than the carbon content of the first tensile dielectric layer 14. It should also be noted that even though only two tensile dielectric layers 14 and 16 are disclosed in this embodiment, the quantity of the tensile dielectric layers is not limited to two, but could be any integer greater than or equal to two while the upper layers preferably contain carbon content higher than the lower layers.

According to an embodiment of the present invention, the carbon content of each of the tensile dielectric layers 14 and 16 could be adjusted by treatments such as a curing process and/or a helium treatment. For instance, a curing process and/or a helium treatment could be performed selectively on either one or both of the first tensile dielectric layer 14 and second tensile dielectric layer 16 after the two layers are deposited, and depending on the demand of the product, the two types of treatments could be conducted interchangeably or individually without one another.

By increasing the carbon content in the second tensile dielectric layer 16, the dielectric constant (k-value) of the two layers is reduced and the difficulty for removing the dielectric layer, or preferably the second tensile dielectric layers 16 during a chemical mechanical polishing (CMP) process also increases accordingly. As a result, only minimal amount of the dielectric layer is lost during CMP process and the height of the two dielectric layers 14 and 16 is also well maintained.

In addition to the aforementioned treatments, it would also be desirable to implant phosphorus ions into the first tensile dielectric layer 14 for preventing ions from diffusing from the device into the dielectric layers. Moreover, it should be noted that in addition to forming the second tensile dielectric layer 16 directly on top of the first tensile dielectric layer 14, it would also be desirable to conduct a planarizing process to partially remove the first tensile dielectric layer 14 before forming the second tensile dielectric layer 16, in which the planarizing process could be a chemical mechanical polishing (CMP) process. After forming the second tensile dielectric layer 16 atop the thinned first tensile dielectric layer 14, another CMP process could be carried out to remove part of the second tensile dielectric layer 16, which is also within the scope of the present invention.

After the first tensile dielectric layer 14 and second tensile dielectric layer 16 are deposited, as shown in FIG. 2, one or more contact plugs 18 are formed in the two layers 14 and 16. The formation of the contact plugs 18 could be accomplished by first conducting a photo-etching process to form a plurality of contact holes 20 in the first tensile dielectric layer 14 and second tensile dielectric layer 16, and a barrier/adhesive layer (not shown), a seed layer (not shown) and a conductive layer (not shown) are sequentially formed to fill the contact holes 20, in which the barrier/adhesive layer are formed conformally along the surfaces of the contact holes 20 while the conductive layer is formed to completely fill the contact holes 20.

The barrier/adhesive layer may be consisted of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and more preferably tungsten A planarization step, such as a CMP process, an etching back process, or a combination of both could be performed thereafter to remove the barrier/adhesive layer, the seed layer, and the conductive layer for forming the contact plugs 18 in the first tensile dielectric layer 14 and second tensile dielectric layer 16. Preferably, the top surface of the second tensile dielectric layer 16 is even with the top surface of the contact plugs 18. This completes the fabrication of an ILD according to a preferred embodiment of the present invention.

Figure 3:
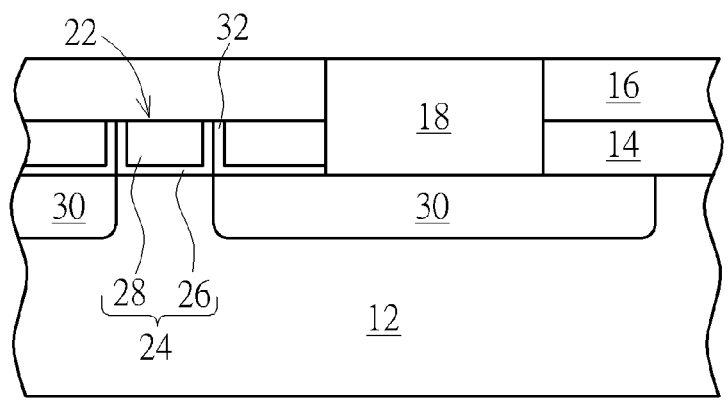
FIG. 3 illustrates a structural view of an ILD layer with a metal gate transistor according to an embodiment of the present invention.

Referring to FIG. 3, which illustrates a structural view of the ILD layer from the aforementioned embodiment along with a metal gate transistor according to an embodiment of the present invention. As shown in FIG. 3, a metal gate transistor 22 is embedded in an ILD layer on the substrate 12, in which the ILD layer includes a first tensile dielectric layer 14 and second tensile dielectric layer 16, and the metal gate transistor 22 preferably includes a metal gate 24 having a high-k dielectric layer (not shown), a U-shaped work function layer 26, a low resistance metal layer 28, and a source/drain region 30 in the substrate 12 adjacent to two sides of the metal gate 24. A contact etch stop layer (CESL) 32 could be formed on the substrate 12 and adjacent to the sidewall of the metal gate 24. The top surface of the first tensile dielectric layer 14 is preferably even with the top surface of the metal gate 24 and the CESL 32 while the second tensile dielectric layer 16 is stacked on top of the first tensile dielectric layer 14 and the metal gate 24. A contact plug 18 is electrically connected to the source/drain region 30 of the metal gate transistor while embedded in the first tensile dielectric layer 14 and second tensile dielectric layer 16. It should be noted that even though the first tensile dielectric layer 14 is a single-layered structure, the first tensile dielectric layer 14 could also be a composite layer consisting of two or more tensile dielectric layers, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a first tensile dielectric layer on the substrate;
   a metal gate in the first tensile dielectric layer;
   a second tensile dielectric layer on the first tensile dielectric layer, wherein a carbon content of the second tensile dielectric layer is greater than the carbon content of the first tensile dielectric layer; and
   a contact plug in the first tensile dielectric layer and the second tensile dielectric layer, wherein the top surface of the contact plug is even with the top surface of the second tensile dielectric layer.

2. The semiconductor device of claim 1, wherein the metal gate comprises:
   a U-shaped work function layer; and
   a low resistance metal layer on the U-shaped work function layer.

3. The semiconductor device of claim 1, further comprising a contact etch stop layer (CESL) adjacent to the metal gate.

4. The semiconductor device of claim 3, wherein the top surface of the CESL is even with the top surface of the first tensile dielectric layer.

5. The semiconductor device of claim 1, wherein the top surface of the metal gate is even with the top surface of the first tensile dielectric layer.

* * * * *